United States Patent [19]
Lin et al.

[11] Patent Number: 5,414,664
[45] Date of Patent: May 9, 1995

[54] FLASH EPROM WITH BLOCK ERASE FLAGS FOR OVER-ERASE PROTECTION

[75] Inventors: Tien-Ler Lin, Cupertino; Ray L. Wan, Milpitas, both of Calif.; Ling-Wen Hsiao, Taipei; Gilbert Sung, Ping-Chan City, both of Taiwan, Prov. of China

[73] Assignee: Macronix International Co., Ltd., Hsinchu, Taiwan, Prov. of China

[21] Appl. No.: 108,662

[22] PCT Filed: May 28, 1993

[86] PCT No.: PCT/US93/05146
§ 371 Date: Aug. 31, 1993
§ 102(e) Date: Aug. 31, 1993

[51] Int. Cl.[6] .......................... G11C 7/00; G11C 16/00
[52] U.S. Cl. ..................................... 365/218; 365/185; 365/230.03; 365/900
[58] Field of Search ............ 365/185, 900, 218, 230.03

[56] References Cited

U.S. PATENT DOCUMENTS

| | | | |
|---|---|---|---|
| 4,875,188 | 10/1989 | Jungroth | 365/185 |
| 5,050,125 | 9/1991 | Momodomi et al. | 365/185 |
| 5,065,364 | 11/1991 | Atwood et al. | 365/185 |
| 5,091,888 | 2/1992 | Akaogi | 365/210 |
| 5,095,461 | 3/1992 | Miyakawa et al. | 365/185 |
| 5,117,394 | 5/1992 | Amin et al. | 365/203 |
| 5,142,496 | 8/1992 | Van Buskirk | 365/201 |
| 5,163,021 | 11/1992 | Mehrotra et al. | 365/185 |
| 5,197,034 | 3/1993 | Fandrich et al. | 365/227 |
| 5,212,663 | 5/1993 | Leong | 365/189.01 |
| 5,297,096 | 3/1994 | Terada et al. | 365/218 |
| 5,297,148 | 3/1994 | Harari et al. | 371/10.2 |

*Primary Examiner*—Do Hyun Yoo
*Attorney, Agent, or Firm*—Haynes & Davis

[57] ABSTRACT

A FLASH EPROM device includes a memory array organized into a plurality of blocks of memory cells. An energizing circuit applies energizing voltages to the blocks of memory cells to read and program addressed cells, and to erase selected blocks or the whole memory array. An erase verify circuit separately verifies erasure of blocks in the plurality of block memory cells. Control logic controls the energizing circuit to re-erase blocks which fail erase verify. The control logic includes a plurality of block erase flags which correspond to respective blocks of memory cells in the array. The erase verify is responsive to the block erase flags to verify only those blocks having a set block erase flag. If the block passes erase verify, then the block erase flag is reset. Only those blocks having a set block erase flag after the erase verify operation are re-erased. To support this operation, the circuit also includes the capability of erasing only a block of the memory array at a time.

12 Claims, 8 Drawing Sheets

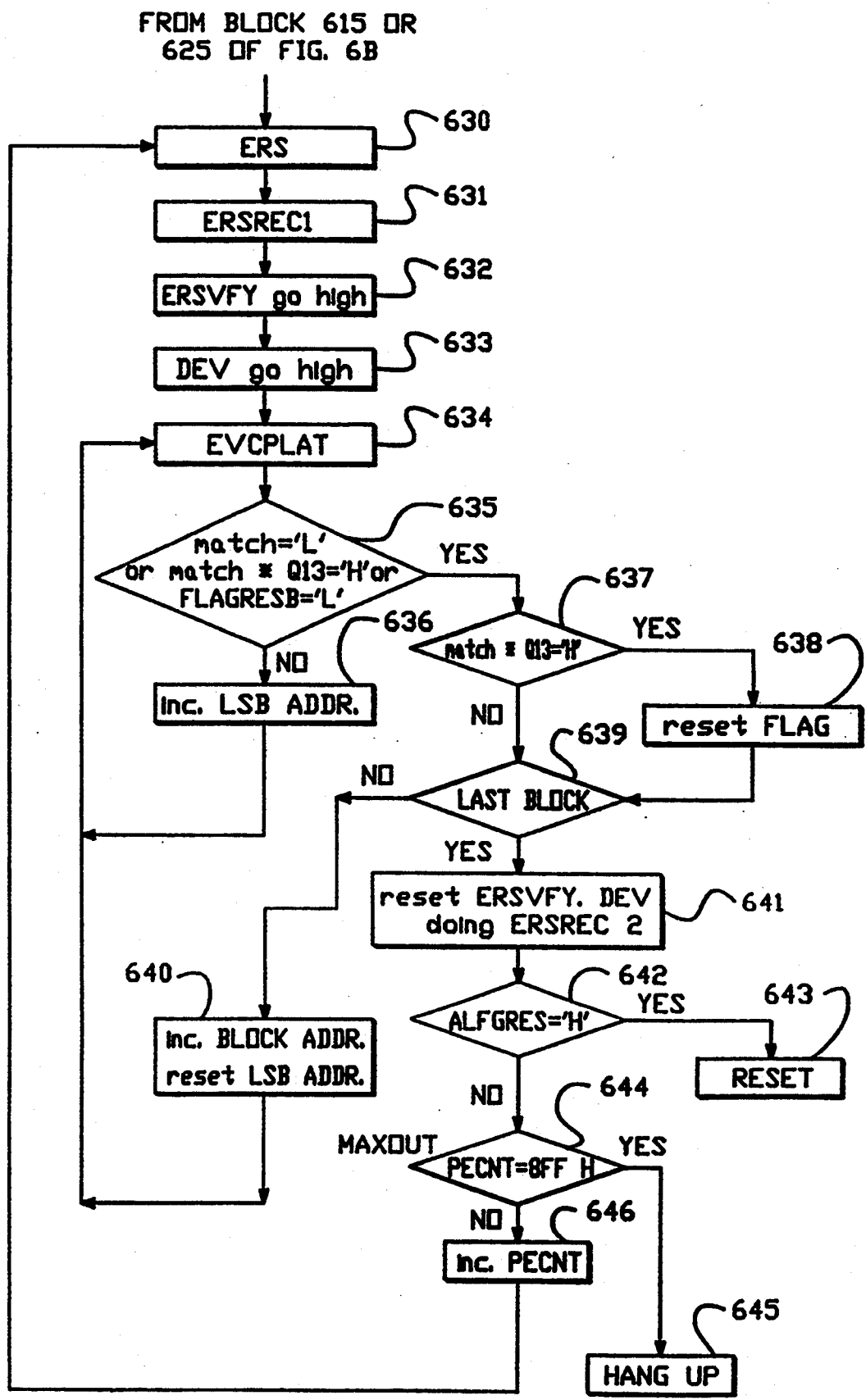
FIG.—6C

FLASH EPROM WITH BLOCK ERASE FLAGS FOR OVER-ERASE PROTECTION

BACKGROUND OF THE INVENTION

1. Field of the Invention

The present invention relates to the design of erasable and programmable non-volatile memory devices; and more particularly to circuits for erasing memory cells in FLASH EPROM devices.

2. Description of Related Art

Non-volatile memory design based on integrated circuit technology represents an expanding field. One popular class of non-volatile memory cell is known as the erasable-programmable read only memory (EPROM). Two popular EPROM designs are distinguished in the manner in which isolation of the memory cells is carried out. The first is referred to as the EEPROM. A second member of this class is known as the FLASH EPROM which uses a higher density format.

Both the FLASH EPROM and EEPROM technologies are based on a memory cell which consists of a source, channel, and drain with a floating gate over the channel and a control gate isolated from the floating gate. The act of programming the cell involves charging the floating gate with electrons which causes the turn-on threshold of the memory cell to increase. Thus, when programmed the cell will not turn on, that is it will remain non-conductive, when addressed with a read potential applied to its control gate. The act of erasing the cell involves removing electrons from the floating gate to lower the threshold. With the lower threshold, the cell will turn on to a conductive state when addressed with a read potential to the control gate.

Both the FLASH EPROM and EEPROM memory cells suffer the problem of over-erasure. Over-erasure occurs if, during the erasing step, too many electrons are removed from the floating gate leaving a slight positive charge. This biases the memory cell slightly on, so that a small current may leak through the memory cell even when it is not addressed. A number of over-erased cells along a given bitline can cause an accumulation of leakage current sufficient to cause a false reading. The regular EEPROM design use either a two transistor cell structure which includes a pass gate that isolates the memory cell from the bitline or a split-gate structure which behaves like two transistors in series to isolate un-selected cells, so that unselected memory cells do not contribute leakage current to the bitline. The higher density FLASH EPROM cell does not use the isolation transistor or split-gate, so over-erasure causes a significant problem in the FLASH EPROM design.

When floating gate cells are over-erased, it makes it difficult to reprogram the cells successfully using hot electron programming, particularly with embedded algorithms in the integrated circuits that cannot handle special cases.

Further, commercial FLASH EPROM designs include circuitry for verifying the success of programming and erasing steps. See, for instance, U.S. Pat. No. 4,875,188, entitled VOLTAGE MARGINING CIRCUIT FOR FLASH EPROM, invented by Jungroth.

Traditionally, erase verification begins at address 0000 (hex) and continues through the array to the last address, or until data other than FF (hex) is encountered. If a byte fails to verify, the entire device is re-erased. This re-erase operation may result in over-erasure of memory cells that had passed the erase verify voltage margin during the initial erase operation.

Also, the re-erase operation is time consuming, requiring re-verification of the entire array after each re-erase operation.

Accordingly, an erase verify and re-erase system for FLASH EPROM devices is needed which protects against over-erase due to repeated erasures, and which speeds up the verify sequence.

SUMMARY OF THE INVENTION

The present invention provides a FLASH EPROM device which comprises a memory array organized into a plurality of blocks of memory cells. An energizing circuit applies energizing voltages to the blocks of memory cells to read and program addressed cells, and to erase the memory array. An erase verify circuit separately verifies erasure of blocks in the plurality of block memory cells. Control logic controls the energizing circuit to re-erase blocks which fail erase verify.

The control logic includes a plurality of block erase flags which correspond to respective blocks of memory cells in the array. The erase verify is responsive to the block erase flags to verify only those blocks having a set block erase flag. If the block passes erase verify, then the block erase flag is reset. Only those blocks having a set block erase flag after the erase verify operation are re-erased. To support this operation, the circuit also includes the capability of erasing only a block or multiple blocks of the memory array at a time.

Thus, a flag is associated with each block in the memory array to indicate the erase status of each of the block. If the flag is on or set, then for that particular block identified by the most significant bits in the address, the block is erased and then erase verify operations go through every address by counting through the least significant bits of the address inside the block. If the flag is off for that block, then the internal state machine skips the block without erasing or erase verify.

The flags are set at the beginning of the erase mode by the user. The user is able to select from one to the complete number of blocks on the chip.

Thus, the present invention provides for embedded erase operations which have over-erase protection by preventing memory blocks which passed erase verify from being re-erased. Also, block skipping control circuit bypasses blocks with flags off during the erase verify operation to speed up the operation significantly.

Accordingly, an integrated circuit memory is provided with an embedded erase operation which is responsive to a command supplied to the chip, to enter a block erase mode. During the first part of the algorithm, flags are set for selected blocks. Next, a pre-programming operation to equalize charge in the floating gates and program verify operations are carried out on the selected blocks only. After program verification for the selected blocks, an erase operation is executed on selected blocks in parallel. Then, erase verify is executed at the block level, resetting flags for blocks that have been successfully erased. After erase verify, the algorithm loops back to the erase stage and erases only those blocks which have not been successfully erased as indicated by the block erase flags.

Other aspects and advantages of the present invention can be seen upon review of the figures, the detailed description, and the claims which follow.

BRIEF DESCRIPTION OF THE FIGURES

FIGS. 6A–6C provide a more detailed flow chart for the embedded erase operation of the present invention.

DETAILED DESCRIPTION

A detailed description of preferred embodiments of the present invention is provided with reference to the figures.

Figure 1:
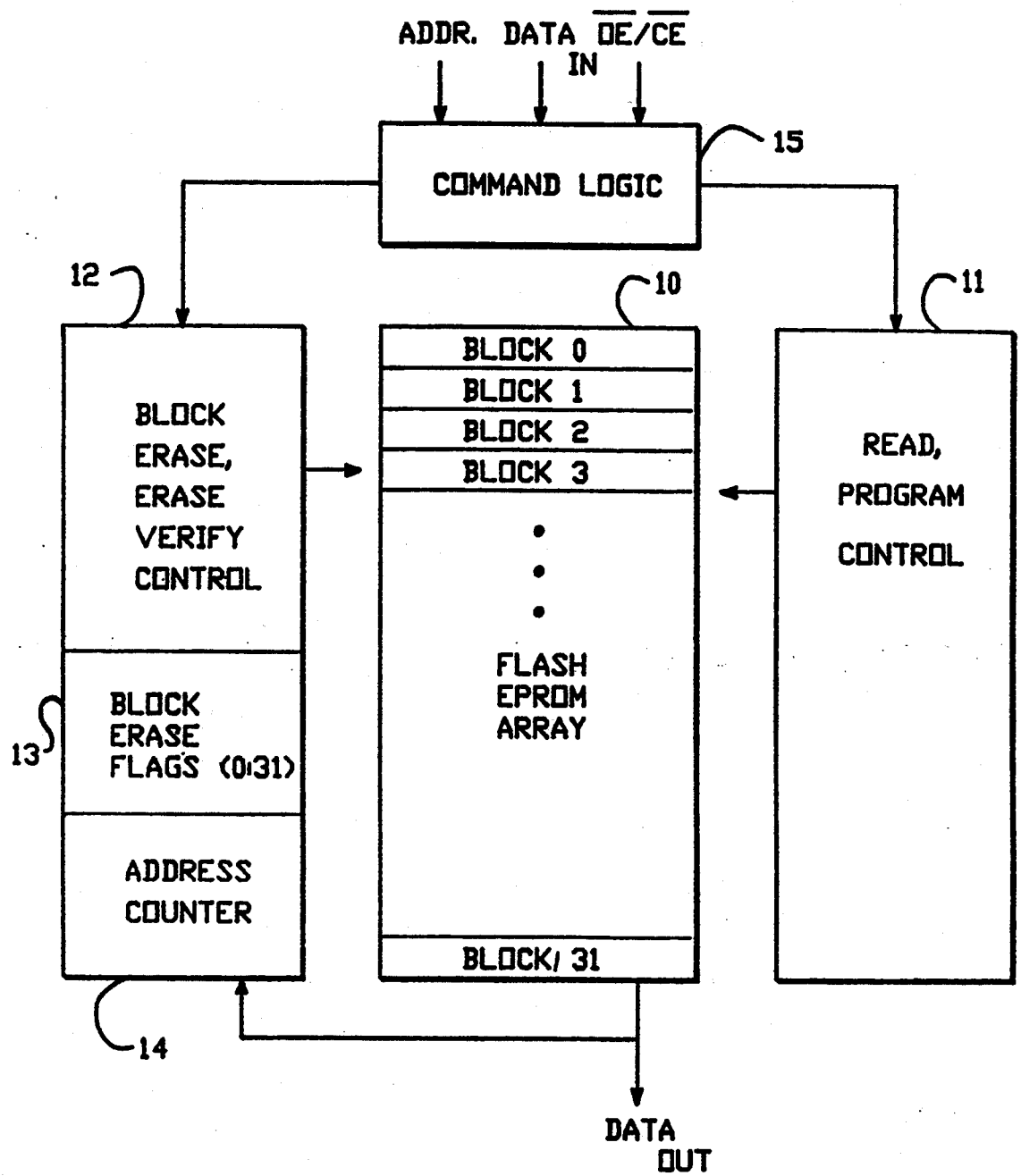
FIG. 1 is a schematic block diagram providing an overview of an integrated circuit according to the present invention.

FIG. 1 shows the basic structure of a 4 megabit FLASH EPROM integrated circuit incorporating the present invention. The circuit includes a FLASH EPROM array, generally 10, which is divided into a plurality of blocks (32 blocks in the figure). The FLASH EPROM array has a segmentable architecture such as that shown in FIG. 2 described below.

Coupled with the array 10 are a read and program control circuit, generally 11, and a block erase and erase verify control circuit, generally 12. The block erase and erase verify control circuit 12 includes a plurality of block erase flags 13 and an address counter 14 for incrementing through memory cells for the erase verify sequence.

The chip includes command logic 15 which is coupled to the address, data, and other control lines, such as the output enable and chip enable signals. The command logic 15 interprets inputs to set a mode of operation for the read and program control logic 11 and the block erase and erase verify control logic 12.

Command logic 15 may be implemented as done in standard FLASH EPROM integrated circuits, such as the Am28F020 flash memory chip manufactured by Advanced Micro Devices, Inc. of Sunnyvale, Calif., with the additional commands according to the present invention for block erase. In response to commands issued by the command logic 15, and embedded block erase operation is executed by state machines in the block erase and erase verify control logic 12. The user, through a host CPU or otherwise, supplies address and data signals to the command logic 15 to indicate a preferred mode of operation. The modes relevant to the present invention include a chip erase mode in which all blocks in the array 10 are to be erased, and a block erase mode in which selected blocks in the array 10 are to be erased. Blocks to be erased are identified by the block erase flags 13.

Because of the architecture of the FLASH EPROM array 10, the blocks within the array are segmentable for the erase operation. An understanding of the array as shown in FIG. 2 demonstrates how the block erase operation may be executed by the control logic.

Figure 2:
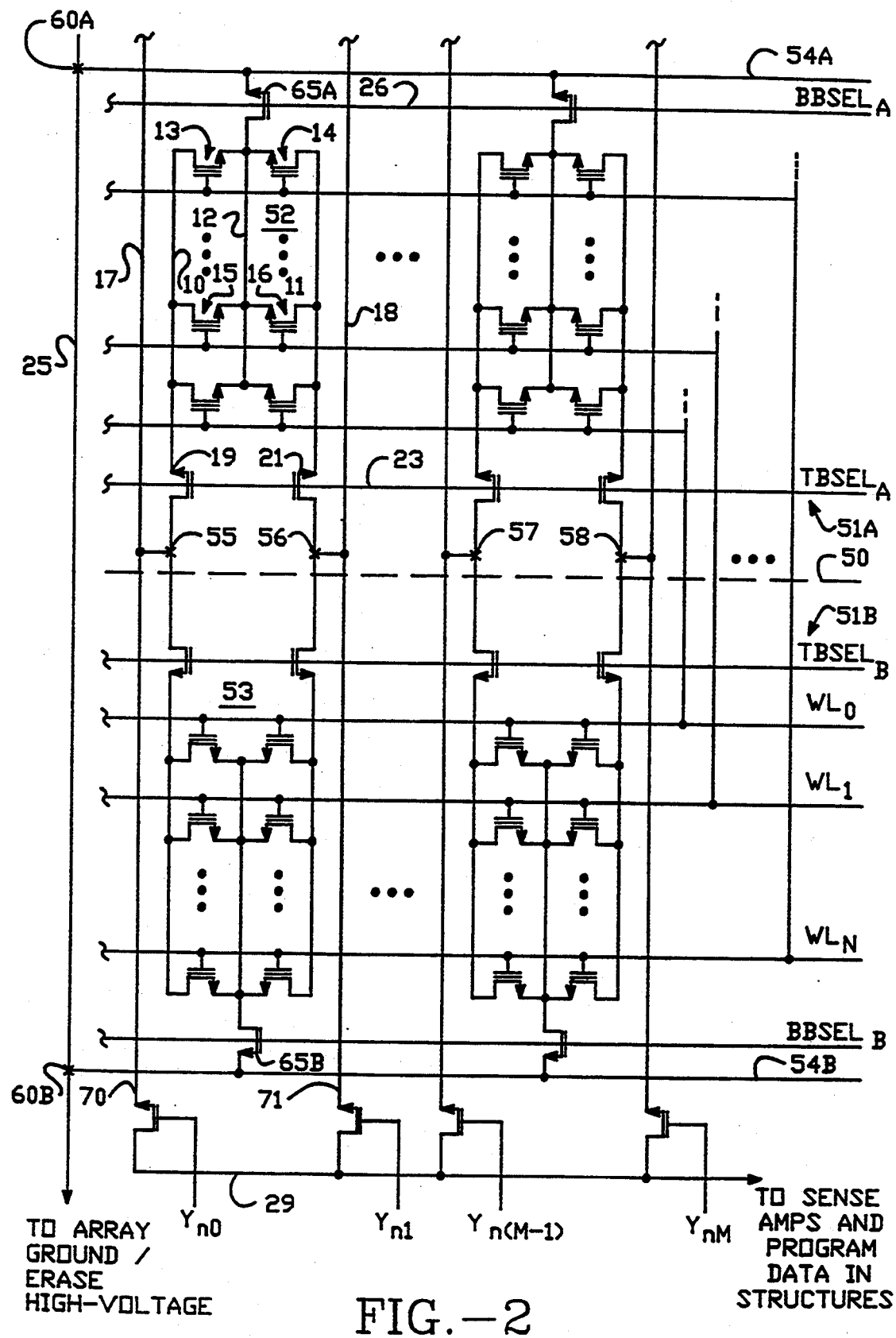
FIG. 2 is a circuit diagram showing a segmented array architecture for a FLASH EPROM array according to the present invention.

FIG. 2 illustrates a segmentable array architecture, using a drain-source-drain configuration of the FLASH EPROM circuit, as described in U.S. patent application Ser. No. 07/823,882, filed Jan. 22, 1992, now abandoned, entitled NON-VOLATILE MEMORY CELL AND ARRAY ARCHITECTURE, owned now and at the time of both inventions by the same Assignee as the present application, and incorporated herein by reference for information about the state of the art.

The circuit includes a first local bitline 10 and a second local bitline 11. The first and second local bitlines 10, 11 are implemented by buried diffusion conductors. Also included is a local virtual ground line 12 implemented by buried diffusion. A plurality of floating gate transistors having gates, drains and sources are coupled to the local bitlines 10, 11 and local virtual ground line 12. The sources of the plurality transistors are coupled to the local virtual ground line 12. The drains of a first column of transistors, generally 13, are coupled to the first local bitline 10, and the drains of a second column of transistors, generally 14, are coupled to the second local bitline 11. The gates of the floating gate transistors are coupled to wordlines $WL_0$ through $WL_N$, where each wordline (e.g., $WL_1$) is coupled to the gate of a transistor (e.g., transistor 15) in the first local bitline 10 and a transistor (e.g., transistor 16) in the second local bitline 11. Thus, transistors 15 and 16 can be considered a two transistor cell with a shared source diffusion.

The act of charging the floating gate is called the program step for the FLASH EPROM cell. This is accomplished on a byte by byte basis through hot electron injection by establishing a large positive voltage between the gate and the source, such as twelve volts, and a positive voltage between the drain and the source, such as six volts.

The act of discharging the floating gate is called the erase step for the FLASH EPROM cell. This is accomplished through F-N (Fowler-Nordheim) tunneling mechanism between the floating gate and the source (source erase) or between the floating gate and the substrate (channel erase). The source erasing is performed by applying a positive bias to the source, such as twelve volts or seven volts, while the gate is grounded or negatively biased, such as minus seven volts. The channel erasing on a block basis is performed by applying a negative bias to the gate and/or a positive bias to the substrate.

A first global bitline 17 and a second global bitline 18 are associated with each drain-source-drain block. The first global bitline 17 is coupled to the source of top block select transistor 19 through a metal-to-diffusion contact 55. Similarly, the second global bitline 18 is coupled to the source of top block select transistor 21 through a metal-to-diffusion contact 56. The drains of the top block select transistors 19, 21 are coupled to the first and second local bitlines 10 and 11, respectively. The gates of the top block selector transistors 19, 21 are controlled by a top block select signal $TBSEL_A$ on line 23.

The local virtual ground line 12 is coupled to a virtual ground terminal across conductor 54A through bottom block selector transistor 65A. The drain of the bottom block select transistor 65A is coupled to the local virtual ground line 12. The source of the bottom block select transistor 65A is coupled to the conductor 54A. The gate of the bottom block select transistor 65A is controlled by a bottom block select signal $BBSEL_A$ across line 26. In the preferred system, the conductor 54A is a buried diffusion conductor which extends to a metal-to-diffusion contact 60A at a position displaced horizontally through the array, which provides contact to a vertical metal virtual ground bus 25.

The global bitlines extend vertically through the array to respective column select transistors 70, 71, through which a selected global bitline is coupled to sense amps and program data circuitry (not shown). Thus, the source of column select transistor 70 is coupled to global bitline 17, the gate of column select transistor 70 is coupled to a column decode signal $Y_{n0}$, and the drain of the column select transistor 70 is coupled to conductor 29.

The blocks of FLASH EPROM cells as shown in FIG. 1 are configured into a plurality of subarrays as illustrated in FIG. 2. FIG. 2 illustrates two subarrays within a larger integrated circuit. The subarrays are divided generally along dotted line 50 and include subarray 51A generally above the line 50 and subarray 51B generally below the line 50. A first group 52 of cells is laid out in a mirror image with a second group 53 of cells along a given bitline pair (e.g., bitlines 17, 18). As one proceeds up the bitline pair, the memory subarrays are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 25 through metal-to-diffusion contacts 60A, 60B. The subarrays repeat on opposite sides of the metal virtual ground line 25 so that adjacent subarrays share a metal virtual ground line 25. The metal virtual ground line 25 is coupled to array ground and erase high-voltage circuitry. Thus, the subarray layout requires two metal contact pitches per column of two transistor cells for the global bitlines and one metal contact pitch per subarray for the metal virtual ground line 25.

Furthermore, two or more subarrays as illustrated in FIG. 2 may share wordline signals as illustrated because of the additional decoding provided by the top and bottom block select signals TBSELA, TBSELB, BBSELA, and BBSELB. In the preferred system, each block is configured to include four subarrays in a column, a row in each subarray, sharing a common wordline drivers with rows in the other three subarrays. Decoding amongst the four subarrays is executed using the top block select transistors in response to TBSLEA and TBSELB. Each subarray includes 32 wordlines and 1K (1,024) bitlines. Thus, with four subarrays, 32 wordlines deep, and 1K bitlines wide, a block of 128K cells is provided. Thirty-two blocks makes a 4 megabit memory.

As can be seen, the architecture according to the present invention provides a sectored FLASH EPROM array. This is beneficial because the source and drain of transistors in non-selected subarrays during a read, program or erase cycle may be isolated from the currents and voltages on the bitlines and virtual ground lines. Thus, during a read operation, sensing is improved because leakage current from subarrays not selected does not contribute to current on the bitlines. During the erase operations, the high voltages of the virtual ground line are isolated from the unselected blocks by the BBSEL transistors. For blocks in the same sector, BBSEL has the same voltage level. BBSEL is driven with high voltage to pass array high voltage when the sector flag is set, and with zero volts when sector flag is reset. This allows a sectored erase operation.

Figure 3:
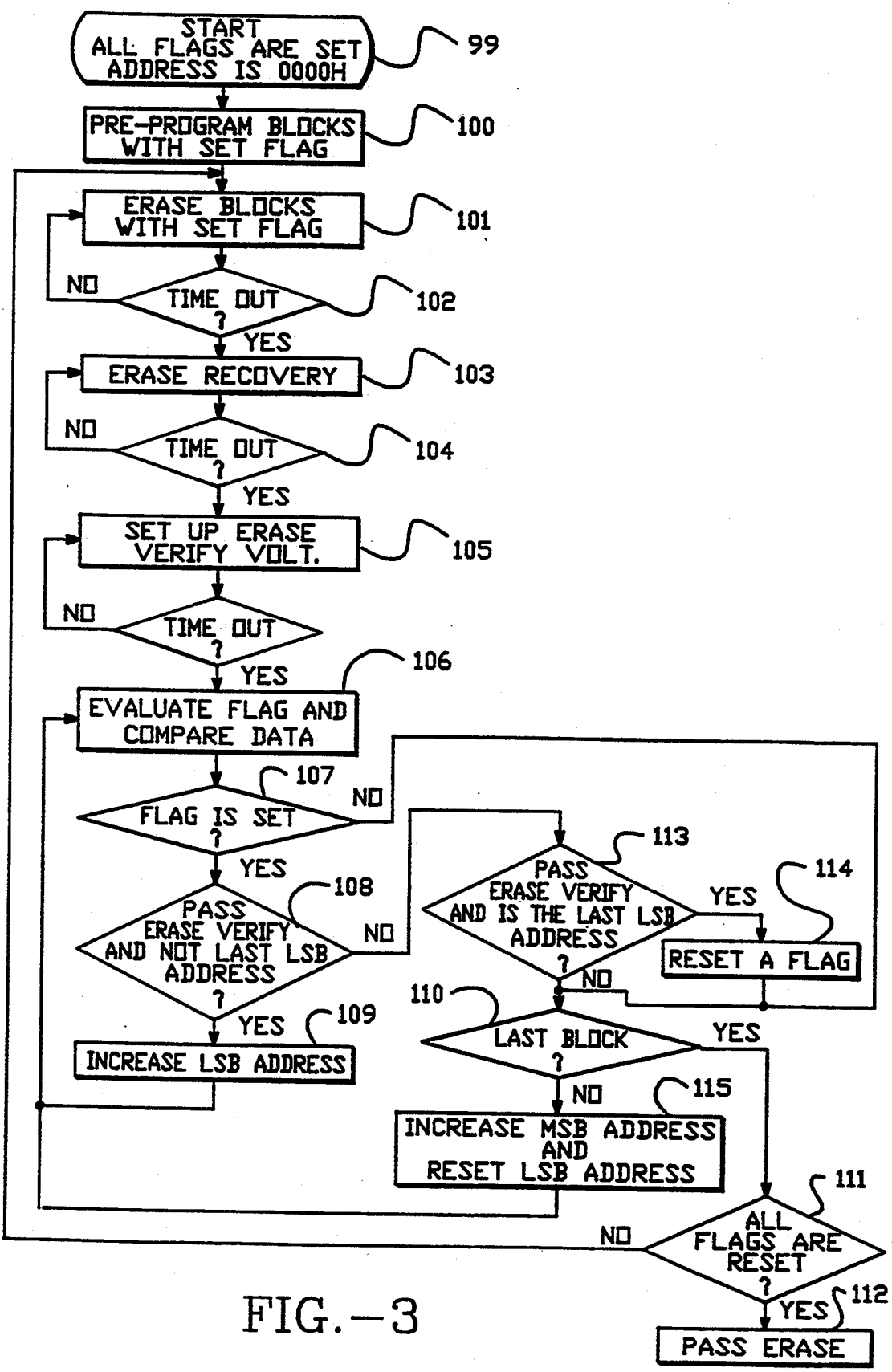
FIG. 3 is a flow chart illustrating the block erase and erase verify operation according to the present invention.

FIG. 3 illustrates the algorithm for embedded erase which is executed by the control logic 12 using the flags 13 and address counter 14 of FIG. 1.

According to the embedded erase algorithm, an erase operation begins at block 99 with the setting of one or more flags. For a chip erase, all flags are set and the address counters are initialized to address 0. If a block erase operation is to be executed, the only flags for selected blocks are set. Next, a pre-program operation is executed on selected blocks (block 100).

In the next step, all the blocks having a set flag are erased (block 101). Then the entire set of selected blocks is erased by applying energizing voltages as described above segmented under control of the bottom block select transmitter.

A timer waits for an erase timeout condition (block 102). After the timeout condition, an erase recovery phase is entered (block 103). Again, this recovery phase is timed as indicated at block 104.

After erase recovery, the erase verify voltages are set up (block 105). This operation is described in detail in our co-pending patent application entitled ERASE AND PROGRAM VERIFICATION CIRCUIT FOR NON-VOLATILE MEMORY invented by Liang Chao, Tien-Ler Lin and Tom D. Yiu, filed on the same day as the present application, and which is incorporated by reference.

The next step is to evaluate the flag and compare the data in each location inside the blocks having a set flag (block 106). This routine involves determining whether the flag is set (block 107). If it is set, the routine checks first for an erase verify pass and overflow of the least significant bit counter (block 108). If a pass is detected and the counter is not at the end of the block, then the least significant bit address is incremented (block 109). At this point, the algorithm loops back to block 106.

If the flag is not set, then the algorithm loops to block 110 where it tests to determine where the last block has been tested. If it has been tested, then the algorithm loops to block 111 to determine whether all flags have been reset. If all have been reset, or are in a reset state at the beginning of the routine, then the algorithm indicates that the erase is done (block 112). If all flags have not been reset, then the algorithm loops back to block 101 to re-erase blocks having a set flag.

If, at block 108, a cell did not pass erase verify or passes but is the last LSB in the block, then the algorithm branches to block 113. In block 113, the algorithm again tests for erase verify pass and the end of the block. If the cell is at the end of the block and passes, then the flag for the block is reset (block 114). If the cell is not at the end of the block or a cell has an erase verify fail, then the algorithm branches to block 110 where it tests to determine whether the last block has been checked. If the last block has not been checked, then the MSB address is incremented to go to the next block, and the LSB address is reset (block 115). At that point, the algorithm loops back to block 106 to loop through other blocks having a set flag for erase verify.

In the preferred system, this control loop shown in FIG. 3 is implemented using a state machine and timer to time program, program verify, erase and erase verify operations coupled to the address counter 14 and the block erase flags 13.

Figure 4:
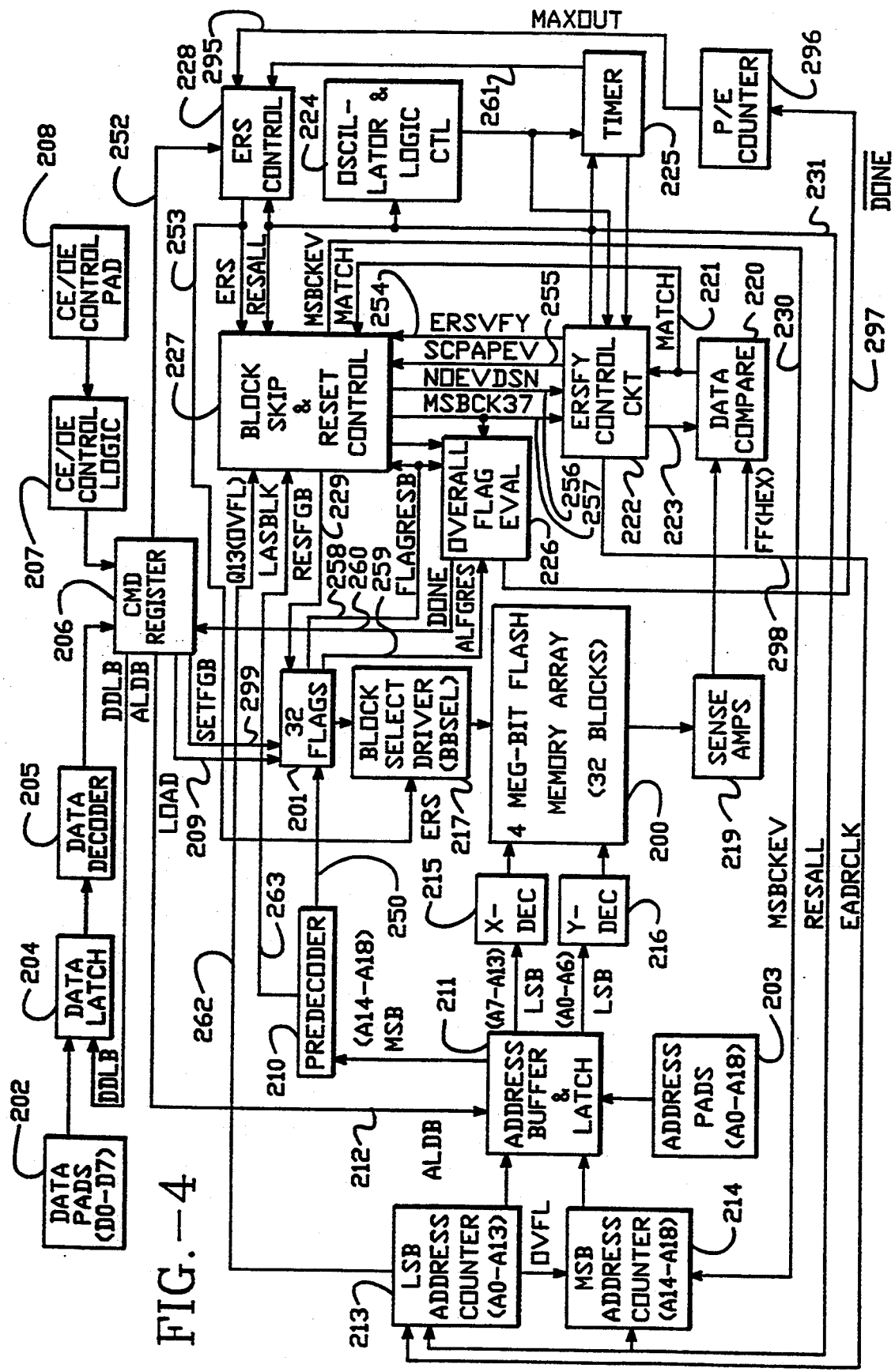
FIG. 4 is a more detailed block diagram of the block erase with over-erase protection system of the present invention.

FIG. 4 illustrates a more detailed block diagram of the erase and erase verify control for the integrated circuit of the present invention. The circuit includes a 4 megabit flash memory array 200 including 32 blocks in this example. Associated with the 32 blocks in the memory array 200 are 32 flag registers 201. Each of the 32 flag registers 201 corresponds to a particular block in the memory array 200.

The integrated circuit has data pads 202 and address pads 203 for inputting and outputting data and inputting addresses to the chip. The data pads 202 are coupled to a data latch 204. The data latch 204 is coupled to a decoder 205 which drives a command register 206 to set a mode of operation for the chip. Also coupled to the command register 206 are output enable and chip enable control logic 207 which are driven by the output enable and chip enable control pads 208.

When the command register 206 indicates a block erase mode, it issues a load signal on line 209 to the flags 201 and a control signal on line 252 to ERS control logic 228. The flags 201 to be set in response to the load signal on line 209 for a block erase are indicated at the output of predecoder 210 on line 250. Predecoder 210 is driven by the most significant bits out of the address buffer and latch 211. The address buffer and latch 211 in this instance is driven by the signals on the address pads 203 for block erase. Thus, when a block erase mode is set, as part of the command sequence, the address for the blocks to be erased are supplied through the address pads 203. These addresses are predecoded by predecoder 210 to select flags in the flag registers 201 to be set in response to the load signal on line 209. During chip erase operation mode, all flags are set by SETFGB signal on line 299.

During sector erase mode operations, the command register 206 issues a control signal on line 212 to cause the address buffer and latch 211 to select the output of the LSB address counter 213 and MSB address counter 214 to drive the array or the address pads 203 during loading, as appropriate. The addresses are supplied through X decoder 215 and Y decoder 216 to address the array. The block select driver 217 is controlled by the flags in flag register 201 for the erase and erase verify mode as indicated from the ERS control logic 228 across line 253.

The ERS control block 228 also controls the high voltage generation during the erase mode in response to inputs on line 261 from the timer circuits 225.

Addressed locations during the verify or read operations are connected to sense amps 219. The output of the sense amps 219 are connected to a comparator 220, which compares the data stored in the address locations to FF (hex), which is expected for an erased cell (00 (hex) for pre-program verify). The MATCH output of the comparator 220 is supplied on line 221 to block skip and reset control circuit 227 when Q13 is high and to the erase verify control circuit 222 which generates the EADRCLK on line 298 to increment the LSB address when Q13 is low. The erase verify control circuit 222 also controls the timing of the comparator 220 as indicated across line 223. Other inputs to the erase verify control circuit 222 include signals from the oscillator and logic control block 224 and from timers 225 which control the timing of critical events in the erase sequence.

Overall flag evaluation circuit 226 receives the MSBCK37 signal from block skip and reset control circuit 227, and the FLAGRESB signal on line 258 and the ALFGRES signal on line 259 from flag registers 201. It supplies the DONE signal on line 260, when all flags have been reset, and the DONE signal on line 297, to increment the P/E counter when all flags have not been reset during an overall flag evaluation interval.

The erase verify control circuit 222 generates the ERSVFY signal on line 254 during an erase verify operation, and the SCPAPEV signal on line 255 indicating a verify operation for the embedded chip or block erase operation.

The block skip and reset control circuit 227 supplies the NOEVDSN signal on line 256 to the erase verify control circuit 222 and the MSBCK37 signal on line 257 to the erase verify control circuit 222. NOEVDSN is high during flag evaluation to prevent LSB address increment. More details concerning the block skip and reset control circuit 227 are provided below with respect to FIG. 5.

The block skip and reset control circuit 227 also receives the ERS signal on line 253 and the RESALL signal on line 231 from the ERS control block 228 which is coupled to all of the major logic blocks and used to reset all of the counters, registers and the like in the system. Other inputs to the block skip and reset control block 227 include the Q13 (or OVFL) signal on line 262 generated by the LSB counter 213 when the counter overflows, and the LASBLK signal on line 263 generated by the predecoder 210 indicating the last block on the chip has been accessed.

Other outputs from the block skip and reset control circuit 227 include the RESFGB signal on line 229 used to reset a flag in the flag block 201, and the MSBCKEV signal on line 230 used to signal the MSB address counter 214 to increment to a new block.

The P/E counter 296 generates a MAXOUT signal on line 295, which is connected to erase control block 228. The MAXOUT signal is high when the number of erase or program retries in a given operation exceed a preset limit.

The block skip and reset control block 227 is also coupled with the erase verify control circuit and controls resetting flags and the address counters for the state machine. The detailed logic of block 227 is shown in FIG. 5.

Figure 5:
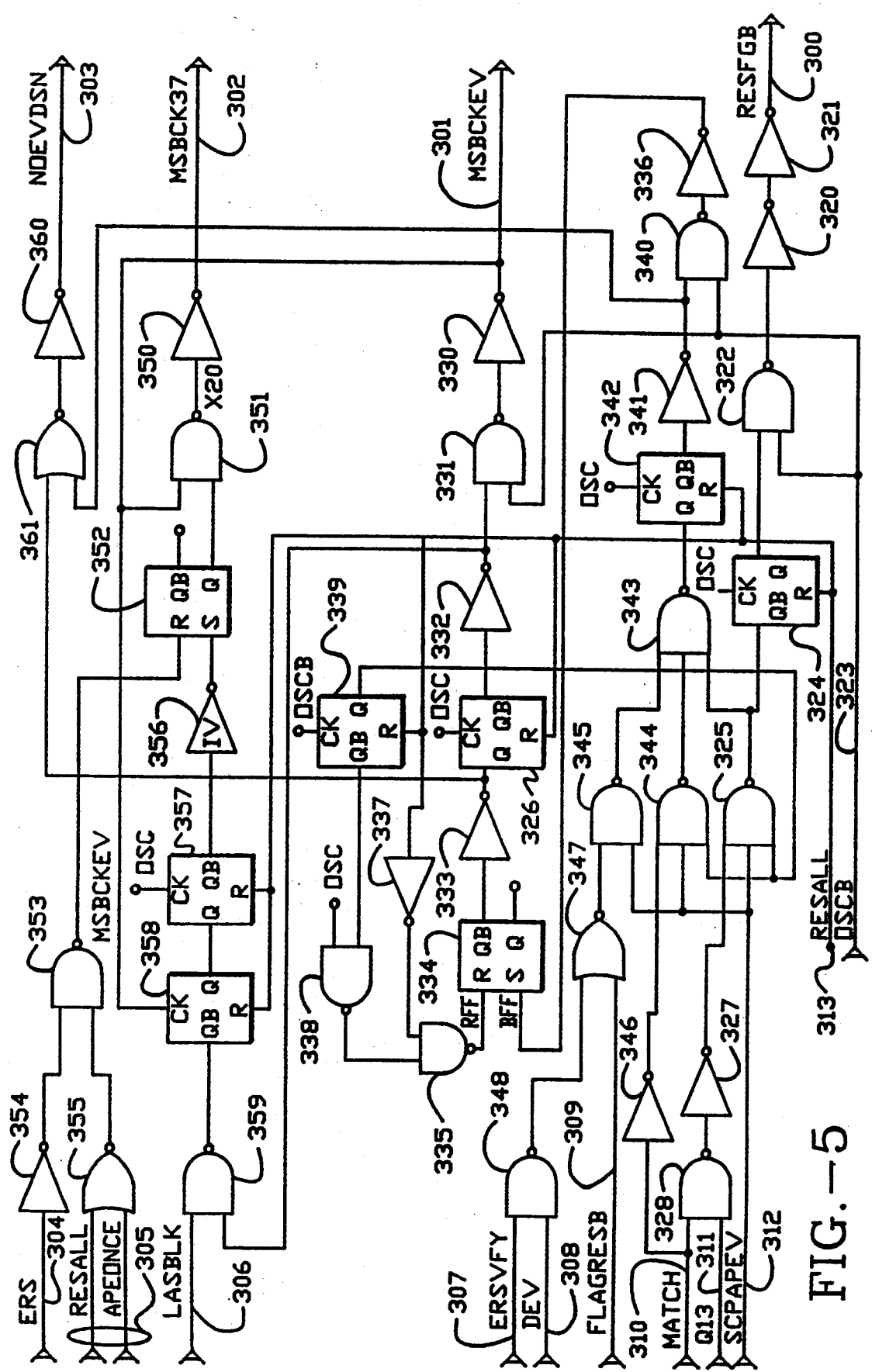
FIG. 5 is a detailed logic diagram of the block skipping control circuit for the block erase and erase verify operations according to the present invention.

FIG. 5 provides a logic diagram for the block skip and reset control logic 227. The circuit shown in FIG. 5 generates four major control signals for block flag evaluation. These include the RESFGB signal which resets the flag of the block in which all LSB have passed verification on line 300. The MSBCKEV signal on line 301 increments the MSB address counter to move to a new block if the last LSB has verified correctly or if any LSB failed verification, or if a new block has a reset flag. The MSBCK37 signal on line 302 indicates to the state machine that all blocks have been gone through, and it is time to reevaluate flag status. The NOEVDSN signal on line 303 causes the LSB address counter to stop during the flag evaluation period for a new block.

The inputs to the diagram include the ERS signal on line 304 which indicates an erase mode. Also, reset and test signals RESALL and APEONCE on lines 305 are supplied as input. The operation of these signals is not important to the present invention and are low during the erase operation.

Another input is the LASBLK signal on line 306 driven by MSB address counter 214 which indicates that the last block in the chip has been addressed.

The ERSVFY input signal on line 307 is generated during an erase verify operation and the DEV signal on line 308 is generated as a delayed version of the ERSVFY signal for control purposes. The signal FLA- GRESB on line 309 is active low when the flag of the selected block has been reset.

The signal MATCH on line 310 is the output of the comparator indicating a pass erase verify for a given address. The signal Q13 on line 311 is an LSB overflow signal indicating that the last LSB in the block has been tested.

The signal SCPAPEV on line 312 indicates a verify operation for the embedded chip or block erase operation. The RESALL signal is a global reset signal on line 313. Also, inputs to the logic include various oscillators for timing purposes.

The RESFGB signal on line 300 is generated at the output of the string of inverters 320 and 321. The input to inverter 320 is the output of NAND gate 322. The inputs to NAND gate 322 include the oscillator signal OSCB on line 323 and the output of latch 324. The input to latch 324 is the output of NAND gate 325. The inputs to NAND gate 325 include the output of latch 326, the SCPAPEV signal on line 312, and the output of inverter 327. The input to inverter 327 is the output of NAND gate 328. The inputs to NAND gate 328 include the MATCH signal on line 310 and the Q13 signal on line 311. The latch 326 indicates when it is time to move to a new block. The control signal SCPAPEV on line 312 indicates the proper mode of operation. The output of NAND gate 328 indicates whether a successful erase verify for the block has occurred. If all these conditions are true, then the reset flag signal RESFGB on line 300 is generated in time with the OSCB signal on line 323.

The MSBCKEV signal on line 301 is generated at the output of inverter 330. The input to inverter 330 is the output of NAND gate 331. The inputs to NAND gate 331 include the OSCB signal on line 323 and the output of inverter 332. The input to inverter 332 is the output of latch 326. Input to latch 326 is the output of inverter 333. The input to inverter 333 is the active low output of SR flip-flop 334. The R input to flip-flop 334 is the output of NAND gate 335. The inputs to NAND gate 335 include the output of inverter 337 which is driven by the RESALL signal on line 313. The other input is the output of NAND gate 338. NAND gate 338 is driven by the OSC signal and by the output of latch 339. The input to latch 339 is the output of latch 326. Thus, the output of NAND gate 335 is a timing signal.

The S input to flip-flop 334 is the output of inverter 336. The driver of inverter 336 is NAND gate 340. The inputs to NAND gate 340 include the OSCB signal on line 323 and the output of inverter 341. Inverter 341 is driven by latch 342. The input to latch 342 is the output of NAND gate 343. Inputs to NAND gate 343 include the output of NAND gate 325, the output of NAND gate 344, and the output of NAND gate 345. The output of NAND gate 344 indicates a failed erase verify by input driven by inverter 346. Inverter 346 is driven by the MATCH signal on line 310. The other inputs to NAND gate 344 include the SCPAPEV signal on line 312 indicating the proper mode and the output of latch 326 indicating the proper timing.

The output of NAND gate 345 is generated if there is no set flag. This is indicated at the output of NOR gate 347. The inputs to NOR gate 347 include the FLAGRESB signal on line 309 and the output of NAND gate 348. The inputs to the NAND gate 348 include the ERSVFY signal and the DEV signal on lines 307 and 308.

Thus, the MSBCKEV signal on line 301 is driven primarily by the output of inverter 336 which is driven by logic that indicates that there are no set flags, that the current block has had an erase verify failure, or that the current block has passed erase verify.

The MSBCK37 signal on line 302 is driven by the output of inverter 350. Inverter 350 is driven by NAND gate 351. The inputs to NAND gate 351 include the MSBCKEV signal on line 301 and the output of SR flip-flop 352. The R input to flip-flop 352 is driven by NAND gate 353. Inputs to NAND gate 353 include the output of inverter 354 which is driven by the ERS signal on line 304 and the output of NOR gate 355 indicating a test condition. The S input to SR flip-flop 352 is driven by inverter 356. The input to inverter 356 is the active low output of latch 357. Latch 357 is driven by the active high output of latch 358. Latch 358 is driven by NAND gate 359. The inputs to NAND gate 359 include the output of inverter 332 for timing purposes and the LASBLK signal on line 306. Thus, the MSBCK37 signal is generated after all blocks have been passed through by the state machine and it is time to return to overall flag evaluation.

The NOEVDSN signal on line 303 is driven by inverter 360. The input to inverter 360 is the output of NOR gate 361. Inputs to NOR gate 361 include the output of inverter 341 and the output of inverter 333. These signals identify the flag evaluation state.

Figure 6A:
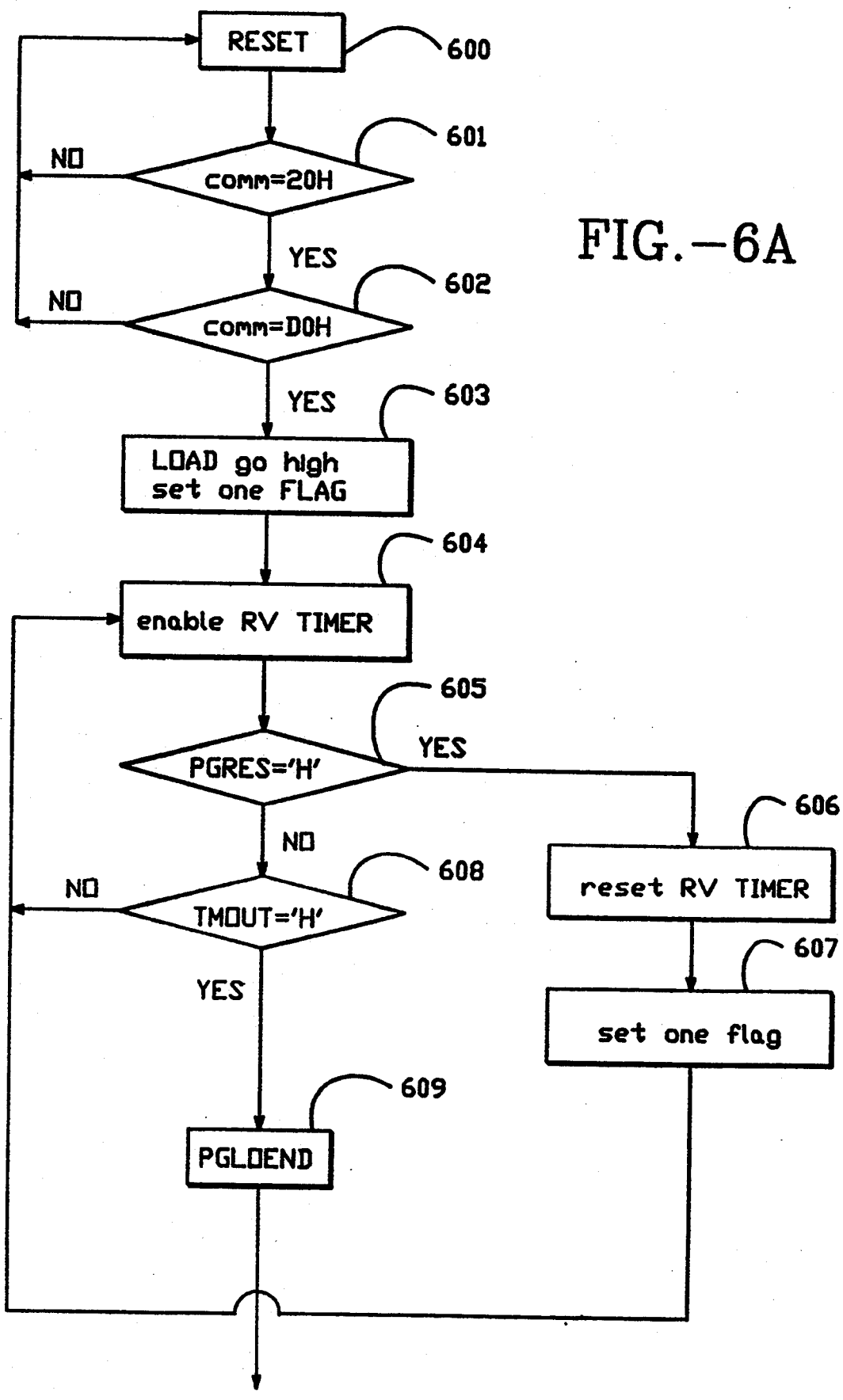
Figure 6B:
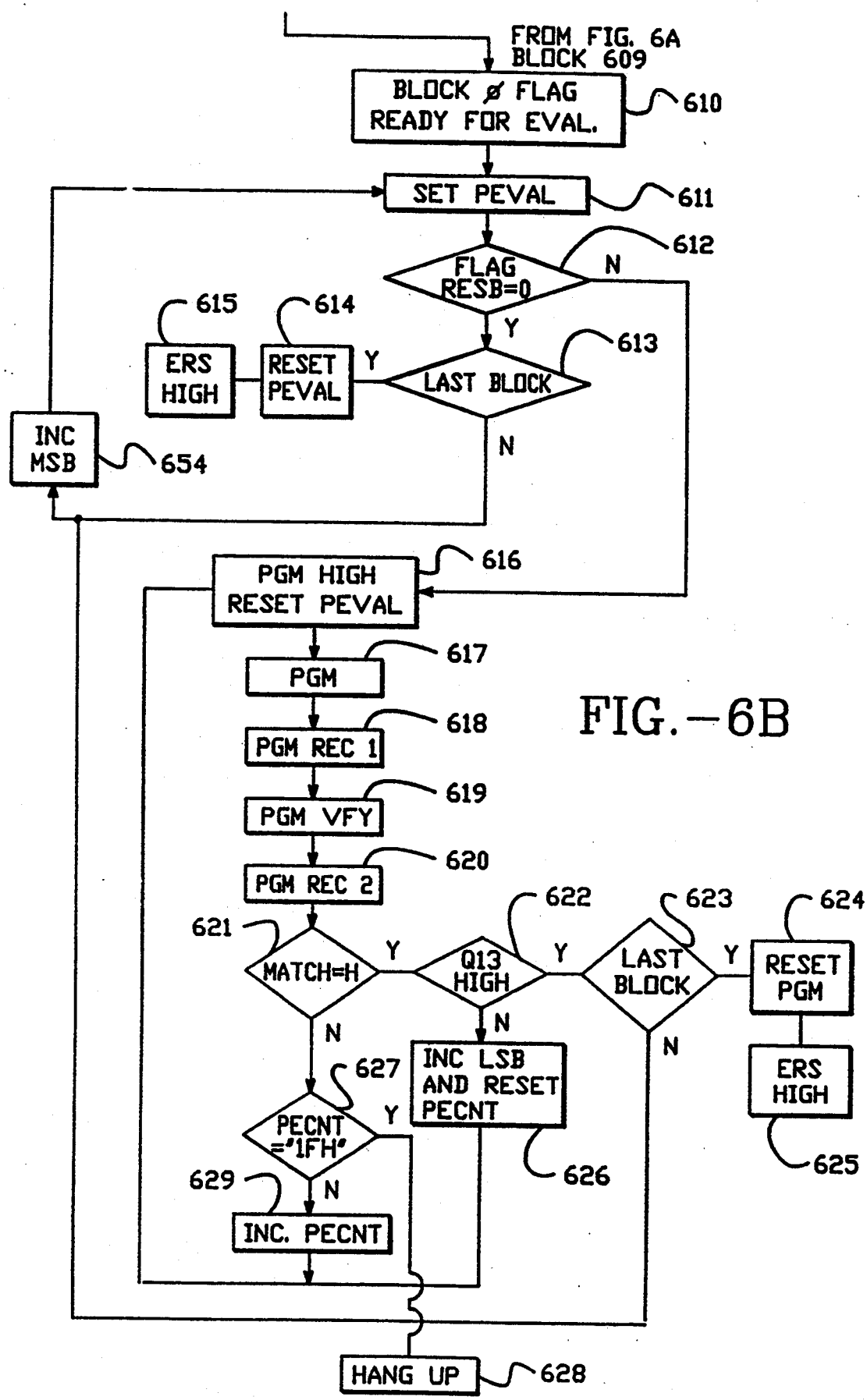

FIGS. 6A–6C provide a detailed flow chart for the embedded sector erase operation according to the present invention, with block level pre-programming, erasing, and verification. The algorithm begins with a loop consisting of steps 600, 601, and 602 in FIG. 6A waiting for a command consisting of a sequence of a 20(hex) followed by a D0(hex) on the input. Thus, the loop includes a reset step 600, which proceeds to a test for 20(hex) (step 601). If the test fails, the algorithm loops back to the reset step 600. If the test is successful, then the algorithm tests for a D0(hex) in step 602. If the test for D0(hex) fails, then the algorithm loops back to the reset step 600. If a sequence of a 20(hex) word followed by a D0(hex) word is detected at step 602, then the algorithm goes to step 603 to assert the LOAD signal. This results in setting one of the 32 flags in response to a decode of the incoming address. At this point, a timer is enabled in step 604. Next, the algorithm tests for assertion of the PGRES signal, which indicates that the chip enable goes low during assertion of output enable to signal that the chip should latch another address and set another flag. If the signal is high, then the algorithm loops to step 606 to reset the RV timer, then a flag is set in response to the input address (step 607). At that point, the algorithm loops back to the step 604 to enable the RV timer.

If the PGRES signal is not high at step 605, then the algorithm tests for expiration of the RV timer (step 608). In the preferred system, this is about 100 microseconds. If the timer has not expired, then the algorithm loops to step 604. If the timer has expired, then the PGLOEND signal is asserted at step 609 indicating the ending of the sector address load sequence for latching the blocks to be erased. After step 609, the algorithm loops to FIG. 6B.

In FIG. 6B, the algorithm begins after the set PGLOEND signal in step 609 of FIG. 6A. The flag for block zero is ready for evaluation (step 610) and the PEVAL is set to indicate the pre-programming flag evaluation interval of the erase mode (step 611).

After the setting of PEVAL, the FLAGRESB signal is evaluated in step 612. If the signal is zero, then the algorithm determines whether the last block has been evaluated in step 613. If the last block has been evaluated, then the PEVAL signal is reset in step 614 and the ERS signal is set high in step 615. If at step 613, the last block had not been evaluated, then the MSB counter is incremented in step 654 and the algorithm loops back to step 611 to evaluate the balance of the blocks having set flags.

The FLAGRESB signal is generated by the flag block 201 for the current flag indicated by the signal on line 258 in FIG. 4.

If at step 612, the FLAGRESB was not zero, indicating a set flag, then the algorithm loops to step 616. At step 616, the PGM signal is set high and the PEVAL signal is reset. This results in supplying the programming potentials to the bitlines, wordlines, and virtual ground terminals in the block to be erased. In one embodiment, four wordlines in respective sectors of the memory are enabled and parallel so that four bytes are pre-programmed in parallel.

After enabling the programming voltages as indicated by step 617, a timer PGMREC1 is enabled to wait for program voltage recovery (step 618). After step 618, program verify voltages are driven (step 619). A second verify timer is enabled for program verify voltage recovery in step 620.

After expiration of the timer in step 620, the logic determines whether the output of the comparator that tests the cells energized during step 619 is high (step 621). If it is high, then the algorithm tests whether Q13 is high in step 621, which indicates that the least significant address counter has overflowed. In an embodiment pre-programming four bytes in parallel, when the two least significant bits (Q12, Q13) are masked, the algorithm tests for Q11, which indicates counter overflow for four byte increments. If it has overflowed, then the algorithm determines whether the last block has been verified (step 623). If the last block has been verified, then PGM is reset in step 624 and the ERS signal is set high in step 625.

If at step 623, the last block had not been programmed, then the algorithm loops to step 614 to increment the MSB counter and proceed to the next block having a set flag.

If at step 622, the Q13 (or Q11) value had not overflowed, then the least significant bit counter is incremented by one (or by four when testing on Q11) and the PECNT signal is reset (step 626). Next, the algorithm loops to step 617 to continue programming the block. The PECNT signal is a retry counter which is incremented in the event the match signal at step 621 was not high. Thus, if after step 621 the match signal is not high, the algorithm tests whether the retry counter PECNT has overflowed (block 627). This corresponds to the MAXOUT signal on line 295 of the FIG. 4.

If it had overflowed, then an error is indicated and the algorithm hangs up (step 628). If the counter has not overflowed then it is incremented in step 629 and the algorithm loops back to step 617.

As indicated with respect to FIG. 6B, when the last block has been successfully preprogrammed, the ERS signal is set high, either at step 615 or step 625. After the setting of ERS high, the algorithm loops to the procedure illustrated in FIG. 6C.

As shown in FIG. 6C, the first step is to set up the erase operation by applying the proper erase voltages to the blocks to be erased as controlled to the sources through the bottom block select transistor BBSEL and to the wordlines in an array as shown in FIG. 2 (step 630). After the erase operation, an erase recovery timer is used to allow for recovery of the erase voltages (step 631). After recovery in step 631, the ERSVFY signal goes high and the chip enters an erase verify operation (step 632). Next, the delayed erase verify signal DEV goes high (step 633). At this point, the erase compare latch accepts data from an addressed cell (step 634). After that point, the algorithm, tests for no match, a match and an overflow indicated by the signal Q13, or the FLAGRESB signal being low (step 635). If any one of these conditions is not met, indicating that a successful match on the byte has occurred, or the end of the block has not been reached, or there is a flag still yet to be reset, then the algorithm loops to step 636 where the LSB address is incremented. After step 636, the algorithm returns to step 634 to latch the data from the next byte.

If at step 635 the byte did not verify, or it verified and the address counter had overflowed, or the flag of the block under test had been reset, then the algorithm loops to step 637 where it tests for the successful match with overflow condition. If it is a successful match, then the flag is reset for the block (step 638). After resetting the flag, the algorithm loops back to step 639 where it tests whether the last block has been tested. Similarly, if at step 637 the reason for reaching step 637 was other than a successful match and overflow of the LSB counter, then the algorithm goes to step 639. At step 639, if the last block has not been tested, then the algorithm loops to step 640 where the block address is incremented and the LSB address is reset. From step 640, the algorithm loops to step 634 to begin testing the next block having a set flag.

If at step 639, the last block has been tested, then the algorithm goes to step 641 where the ERSVFY and DEV signals are reset, and a recovery timer is initiated. After expiration of the recovery timer, the ALFGRES signal is tested (step 642). If, in testing the ALFGRES signal, it is determined that all flags have been reset, then the erase operation is complete, and the control circuits reset (step 643). If all flags had not been reset, then the attempt counter PECNT (equivalent to MAXOUT signal) is tested (step 644) to determine whether it has exceeded a selected value, such as 1,024 (8FF hex). If it has exceeded the selected value, then an error has occurred and the attempt is given up (step 645). If the counter in block 644 has not expired, then it is incremented in step 646 and the algorithm loops to step 630 to re-erase blocks that did not pass erase verify.

Thus, the present invention provides a FLASH EPROM integrated circuit including an over-erase protection scheme to free memory blocks which pass erase verify margin of being erased again. In a preferred system, a block which is a unit for the block erase mode and over-erase protection is composed of 128 Kilobits. The system is divided into 32 blocks for 4 Megabits. A flag is associated with each block to indicate the erase status. If the flag is set, then for that particular block, the block is erased and then erase verify operations go through every address. If the flag is off or reset for a given block, then the internal state machine skips the block without doing any operation.

Flags are set at the beginning of the mode operation by the user. The user is able to select 1 to 32 blocks for the erase operation. After the flags are set, the state machine goes to the erase stage, and the blocks with flags on are erased at the same time. Then the state machine starts erase verify from block 0. Before verification is performed, the block skipping control circuitry evaluates the corresponding flag first. For every block having a set flag, each address will then be verified.

If a byte fails to verify, the flag remains on and the state machine will skip the block and move to the next block with the flag on. After the state machine verifies the last least significant bit of the current block correctly, the flag will be turned off or reset. This indicates that the particular block has passed the erase verification process and will become over-erase protected.

The state machine repeats the sequence for each block until all blocks have been processed. Then the state machine checks the flag status again to insure that all flags have been reset. If any one flag has not been reset, the erase operation starts again. Only those blocks having set flags will be erased again. All other blocks having flags off will not be re-erased.

Accordingly, a block erase scheme is provided with over-erase protection, and which is very efficient by skipping verification of blocks that need not be re-verified or have not been subject of the operation. The system is particularly suited to FLASH EPROM integrated circuits as described above. However, it may be equally applied to other EEPROM type systems which may be subject to over-erase problems.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An apparatus for storing data, comprising:
a memory array including a plurality of blocks of FLASH EPROM memory cells;
energizing power supply circuits, coupled with the memory array, to apply energizing voltages to the plurality of blocks of memory cells to read and program addressed memory cells in the memory array and to erase at least a block of the memory array;
erase verify logic, coupled with the memory array, to separately verify erasure of blocks in the plurality of blocks of memory cells; and
control circuits, coupled to the energizing power supply circuits and the erase verify logic to control the energizing power supply circuits to re-erase blocks which fail erase verify and wherein:
the control circuits further include a plurality of block erase flags corresponding to respective blocks in the plurality of blocks of memory cells; and
the erase verify logic further includes logic to control the plurality of block erase flags to indicate blocks to be re-erased and a circuit responsive to the plurality of block erase flags to verify erasure of blocks indicated by the block erase flags.

2. An apparatus for storing data, comprising:
a memory array including a plurality of blocks of FLASH EPROM memory cells;
energizing power supply circuits, coupled with the memory array, to apply energizing voltages to the plurality of blocks of memory cells to read and program addressed memory cells in the memory array and to erase at least a block of the memory array;
erase verify logic, coupled with the memory array, to separately verify erasure of blocks in the plurality of blocks of memory cells; and
control circuits, coupled to the energizing power supply circuits and the erase verify logic, to control the energizing power supply circuits to re-erase blocks which fail erase verify and wherein:
the control circuits further include a plurality of block erase flags corresponding to respective blocks and a state machine; and
the erase verify logic further includes logic to control the plurality of block erase flags to indicate blocks to be re-erased wherein the state machine is responsive to the plurality of block erase flags, and controls re-erase of blocks of memory cells indicated by the block erase flags.

3. The apparatus of claim 2, wherein the control circuits include a control input to receive erase commands, and the state machine is responsive to the erase commands to first erase the plurality of blocks, and then re-erase and re-verify blocks indicated by the block erase flags.

4. An apparatus for storing data, comprising:
a memory array including a plurality of blocks of FLASH EPROM memory cells;
energizing power supply circuits, coupled with the memory array, to apply energizing voltages to the plurality of blocks of memory cells to read and program addressed memory cells in the memory array and to erase selected blocks in the memory array;
erase verify logic, coupled with the memory array, to separately verify erasure of blocks in the plurality of blocks of memory cells; and
control circuits having a control input to receive erase commands indicating the selected blocks to be erased and coupled to the energizing power supply circuits and the erase verify logic, to control the energizing power supply circuits to erase the selected blocks and to re-erase blocks which fail erase verify and wherein:
the control circuits further include a plurality of block erase flags corresponding to respective blocks in the plurality of blocks of memory cells and logic responsive to the control input to set the block erase flags for the selected blocks to be erased; and
the erase verify logic further includes logic to reset the block erase flags for blocks which pass erase verify and a circuit responsive to the plurality of block erase flags to verify erasure of blocks indicated by the block erase flags.

5. An apparatus for storing data, comprising:
a memory array including a plurality of blocks of FLASH EPROM memory cells;
energizing power supply circuits, coupled with the memory array, to apply energizing voltages to the plurality of blocks of memory cells to read and program addressed memory cells in the memory array and to erase selected blocks in the memory array;

erase verify logic, coupled with the memory array, to separately verify erasure of blocks in the plurality of blocks of memory cells; and control circuits having a control input to receive erase commands indicating the selected blocks to be erased and coupled to the energizing power supply circuits and the erase verify logic, to control the energizing power supply circuits to erase the selected blocks and to re-erase blocks which fail erase verify and wherein:

the control circuits further include a plurality of block erase flags corresponding to respective blocks in the plurality of blocks of memory cells, logic responsive to the control input to set the block erase flags for the selected blocks, and a state machine; and the erase verify logic further includes logic to reset the block erase flags for blocks which pass erase verify and the state machine, responsive to the plurality of block erase flags, to control erasing of blocks of memory cells indicated by the block erase flags, until all block erase flags corresponding to the selected blocks have been reset.

6. An apparatus for storing data, comprising:

a memory array including a plurality of blocks of floating gate memory cells;

energizing power supply circuits, coupled with the memory array, to apply energizing voltages to the plurality of blocks of memory cells to read and program addressed memory cells in the memory array and to erase selected blocks in the memory array;

erase verify logic, coupled with the memory array, to separately verify erasure of blocks in the plurality of blocks of memory cells; and control circuits, having a control input to receive erase commands indicating the selected blocks to be erased and coupled to the energizing power supply circuits and the erase verify logic, to control the energizing power supply circuits to erase the selected blocks and to re-erase blocks which fail erase verify and wherein:

the control circuits further include a plurality of block erase flags corresponding to respective blocks in the plurality of blocks of memory cells and logic responsive to the control input to set the block erase flags for the selected blocks; and the erase verify logic further includes logic to reset the block erase flags for blocks with pass erase verify and a circuit responsive to the plurality of block erase flags to verify erasure of blocks indicated by the block erase flags.

7. An apparatus for storing data, comprising:

a memory array including a plurality of blocks of floating gate memory cells;

energizing power supply circuits, coupled with the memory array, to apply energizing voltages to the plurality of blocks of memory cells to read and program addressed cells in the memory army and to erase selected blocks in the memory array;

erase verify logic, coupled with the memory array, to separately verify erasure of blocks in the plurality of blocks of memory cells; and control circuits, having a control input to receive erase commands indicating the selected blocks to be erased and coupled to the energizing power supply circuits and the erase verify logic, to control the energizing power supply circuits to erase the selected blocks and to re-erase blocks which fail erase verify and wherein:

the control circuits further include a plurality of block erase flags corresponding to respective blocks in the plurality of blocks of memory cells and logic responsive to the control input to set the block erase flags for the selected blocks; and the erase verify logic further includes logic to reset the block erase flags for blocks with pass erase verify and the control circuits further include a state machine, responsive to the plurality of block erase flags, to control erasing of blocks of memory cells indicated by the block erase flags, until all block erase flags corresponding to the selected blocks have been reset.

8. A FLASH EPROM integrated circuit, comprising:

memory array including a plurality of blocks of FLASH EPROM memory cells;

a plurality of block erase flags corresponding to respective blocks in the plurality of blocks of memory cells;

command logic, coupled to command inputs, to set the block erase flags corresponding to blocks to be erased;

energizing power supply circuits, coupled with the memory array, to apply energizing voltages to read and program addressed memory cells in the memory array and to erase blocks in the memory array;

erase verify logic coupled with the memory array, for separately verifying erasure of blocks in the plurality of blocks of memory cells and resetting the block erase flags of blocks which pass erase verify; and control circuits, coupled to the plurality of block erase flags, the energizing power supply circuits and the erase verify logic, to control the energizing power supply circuits to erase blocks having the block erase flags set, wherein the erase verify logic further includes a circuit responsive to the plurality of block erase flags, for verifying erasure of only blocks having the block erase flags set.

9. A FLASH EPROM integrated circuit, comprising:

a memory array including a plurality of blocks of FLASH EPROM memory cells;

a plurality of block erase flags corresponding to respective blocks in the plurality of blocks of memory cells;

command logic, coupled to command inputs, to set the block erase flags corresponding to blocks to be erased;

energizing power supply circuits, coupled with the memory array, to apply energizing voltages to read and program addressed memory cells in the memory array and to erase blocks in the memory array:

erase verify logic, coupled with the memory array, for separately verifying erasure of blocks in the plurality of blocks of memory cells and resetting the block erase flags of blocks which pass erase verify; and control circuits, coupled to the plurality of block erase flags, the energizing power supply circuits, and the erase verify logic, to control the energizing power supply circuits to erase blocks having the block erase flags set wherein the erase verify logic further includes:

an address counter, coupled to the plurality of block erase flags, to address memory cells in blocks having the block erase flags set;

a comparator, coupled to the memory array, to test data in the memory cells addressed by the address counter for successful erase; and logic to reset the block erase flags for a tested block of memory cells that is successfully erased.

10. The integrated circuit of claim 9, wherein the control circuits include a state machine, responsive to the plurality of block erase flags, to control erasing and verifying of blocks of memory cells indicated by the block erase flags, until all block erase flags corresponding to selected blocks have been reset.

11. A FLASH EPROM integrated circuit, comprising:

a memory array including a plurality of blocks of FLASH EPROM memory cells;

a plurality of block erase flags corresponding to respective blocks in the plurality of blocks of memory cells;

command logic, coupled to command inputs, to set the block erase flags corresponding to blocks to be erased;

energizing power supply circuits, coupled with the memory array, to apply energizing voltages to read and program addressed memory cells in the memory array and to erase blocks in the memory array;

erase verify logic, coupled with the memory array, for separately verifying erasure of blocks in the plurality of blocks of memory cells and resetting the block erase flags of blocks which pass erase verify; and control circuits, coupled to the plurality of block erase flags, the energizing power supply circuits, and the erase verify logic, to control the energizing power supply circuits, to erase blocks having the block erase flags set wherein the control circuits further include:

a state machine to execute an embedded erase operation having a program mode, a program verify mode, an erase mode and an erase verify mode, and in the program mode controlling the energizing power supply circuits to program data, in the program verify mode controlling the energizing power supply circuits to verify the programming of data programmed in the program mode, in the erase mode controlling the energizing power supply circuits to erase blocks having the block erase flags set, and in the erase verify mode controlling the energizing power supply circuits to verify the erasing of blocks erased in the erase mode and to reset the block erase flags of blocks passing erase verify.

12. The integrated circuit of claim 11, wherein the state machine includes logic in the erase verify mode to sequentially process blocks having the block erase flags set, and bytes in a particular block and if any particular byte in the particular block fails erase verify, then to proceed to a next block having a block erase flag set before completing verification without resetting the block erase flag for the particular block or if all bytes in the particular block pass erase verify, then to reset block erase flag for the particular block and to proceed to a next block having a block erase flag set, until all blocks having the block erase flags set are processed; then after all blocks having the block erase flags set have been processed to return to the erase mode if all block erase flags have not been reset.

* * * * *